(12) United States Patent
Mitsuboshi

(10) Patent No.: US 11,306,223 B2
(45) Date of Patent: Apr. 19, 2022

(54) DOUBLE-SIDED ADHESIVE TAPE, ELECTRONIC INSTRUMENT PROVIDED WITH DOUBLE-SIDED ADHESIVE TAPE, DISASSEMBLY STRUCTURE PROVIDED WITH DOUBLE-SIDED ADHESIVE TAPE, AND ADHERED STRUCTURE

(71) Applicant: SONY CORPORATION, Tokyo (JP)

(72) Inventor: Masahiko Mitsuboshi, Aichi (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/554,165

(22) PCT Filed: Apr. 20, 2016

(86) PCT No.: PCT/JP2016/062477
§ 371 (c)(1),
(2) Date: Aug. 28, 2017

(87) PCT Pub. No.: WO2017/013914
PCT Pub. Date: Jan. 26, 2017

(65) Prior Publication Data
US 2018/0291237 A1 Oct. 11, 2018

(30) Foreign Application Priority Data
Jul. 21, 2015 (JP) .............................. JP2015-144213

(51) Int. Cl.
*C09J 7/38* (2018.01)
*C09J 5/06* (2006.01)
(Continued)

(52) U.S. Cl.
CPC .................. *C09J 7/38* (2018.01); *B32B 5/20* (2013.01); *C09J 5/06* (2013.01); *C09J 7/20* (2018.01);
(Continued)

(58) Field of Classification Search
CPC .................. C09J 7/38; C09J 7/20; C09J 7/30
See application file for complete search history.

(56) References Cited

U.S. PATENT DOCUMENTS

| | | | |
|---|---|---|---|
| 4,397,799 A * | 8/1983 | Edgren | B01J 13/20 264/53 |
| 2001/0055678 A1* | 12/2001 | Murata | C09J 7/38 428/346 |

(Continued)

FOREIGN PATENT DOCUMENTS

| | | |
|---|---|---|
| CN | 1488700 A | 4/2004 |
| CN | 101835862 A | 9/2010 |

(Continued)

OTHER PUBLICATIONS

International Search Report and Written Opinion of PCT Application No. PCT/JP2016/062477, dated Aug. 2, 2016, 02 pages of English Translation and 07 pages of ISRWO.

(Continued)

*Primary Examiner* — Chinessa T. Golden
(74) *Attorney, Agent, or Firm* — Chip Law Group

(57) ABSTRACT

Provided is an adhesion technology that can separate adherends with their recycling as a premise while meeting their reliability guarantee temperature conditions. A double-sided, pressure-sensitive adhesive tape includes a pair of pressure-sensitive adhesive layers and an electrically-conductive heat generating layer disposed between the paired pressure-sensitive adhesive layers. At least one of the paired pressure-sensitive adhesive layers contains a heat-foaming agent, and at least one of opposite end faces of the electrically-conductive heat generating layer extends out beyond a corresponding end face of the at least one pressure-sensitive adhesive layer.

7 Claims, 8 Drawing Sheets

(51) Int. Cl.
- *B32B 5/20* (2006.01)
- *C09J 201/00* (2006.01)
- *C09J 7/20* (2018.01)
- *C09J 7/30* (2018.01)
- *C09J 9/02* (2006.01)
- *C08K 9/10* (2006.01)
- *C08K 3/08* (2006.01)
- *H01M 50/20* (2021.01)
- *H05K 1/18* (2006.01)

(52) U.S. Cl.
CPC . *C09J 7/30* (2018.01); *C09J 9/02* (2013.01); *C09J 201/00* (2013.01); *C08K 3/08* (2013.01); *C08K 9/10* (2013.01); *C09J 2203/326* (2013.01); *C09J 2301/124* (2020.08); *C09J 2301/204* (2020.08); *C09J 2301/302* (2020.08); *C09J 2301/408* (2020.08); *C09J 2301/41* (2020.08); *C09J 2301/412* (2020.08); *C09J 2301/502* (2020.08); *C09J 2400/163* (2013.01); *H01M 50/20* (2021.01); *H05K 1/181* (2013.01); *H05K 2201/10037* (2013.01); *H05K 2201/10053* (2013.01)

(56) References Cited

U.S. PATENT DOCUMENTS

| | | | |
|---|---|---|---|
| 2012/0024469 A1* | 2/2012 | Takamoto | H01L 24/92 156/249 |
| 2012/0034407 A1* | 2/2012 | Yamanaka | C09J 7/29 428/40.2 |
| 2012/0123046 A1 | 5/2012 | Niwa et al. | |
| 2014/0287299 A1* | 9/2014 | Krogdahl | H05K 1/02 429/185 |

FOREIGN PATENT DOCUMENTS

| | | |
|---|---|---|
| CN | 102464953 A | 5/2012 |
| CN | 102956149 A | 3/2013 |
| CN | 103474596 A | 12/2013 |
| EP | 2452961 A1 | 5/2012 |
| EP | 2562737 A2 | 2/2013 |
| JP | 04-198289 A | 7/1992 |
| JP | 07-278335 A | 10/1995 |
| JP | 11-293207 A | 10/1999 |
| JP | 2005-101094 A | 4/2005 |
| JP | 2006-160935 A | 6/2006 |
| JP | 2007-023113 A | 2/2007 |
| JP | 2009-120808 A | 6/2009 |
| JP | 2010-118776 A | 5/2010 |
| JP | 2012-117041 A | 6/2012 |
| JP | 2013-045036 A | 3/2013 |
| JP | 2013-45036 A | 3/2013 |
| JP | 2013-133464 A | 7/2013 |
| JP | 2013-159743 A | 8/2013 |
| JP | 2015-074764 A | 4/2015 |
| JP | 2015-74764 A | 4/2015 |
| KR | 10-2013-0023111 A | 3/2013 |

OTHER PUBLICATIONS

Office Action for CN Patent Application No. 201680012920.2, dated Apr. 1, 2020, 06 pages of Office Action and 08 pages of English Translation.

Office Action for JP Patent Application No. 2017-245089, dated Apr. 7, 2020, 03 pages of Office Action and 03 pages of English Translation.

Office Action for JP Patent Application No. 2017-245089, dated Feb. 10, 2021, 2 pages of Office Action and 4 pages of English Translation.

Office Action for JP Patent Application No. 2017-245089, dated Sep. 1, 2020, 03 pages of Office Action and 03 pages of English Translation.

* cited by examiner

DOUBLE-SIDED ADHESIVE TAPE, ELECTRONIC INSTRUMENT PROVIDED WITH DOUBLE-SIDED ADHESIVE TAPE, DISASSEMBLY STRUCTURE PROVIDED WITH DOUBLE-SIDED ADHESIVE TAPE, AND ADHERED STRUCTURE

CROSS REFERENCE TO RELATED APPLICATIONS

This application is a U.S. National Phase of International Patent Application No. PCT/JP2016/062477 filed on Apr. 20, 2016, which claims priority benefit of Japanese Patent Application No. JP 2015-144213 filed in the Japan Patent Office on Jul. 21, 2015. Each of the above-referenced applications is hereby incorporated herein by reference in its entirety.

TECHNICAL FIELD

The present technology relates to a technology for bonding adherends with each other and separating them from each other.

BACKGROUND ART

As a pressure-sensitive adhesive tape for bonding adherends with each other, the pressure-sensitive adhesive tape disclosed in PTL 1 is known for years. The pressure-sensitive adhesive tape disclosed in PTL 1 is configured including at least a pressure-sensitive adhesive layer with a heat-foaming agent contained therein so that the pressure-sensitive adhesive tape separates from the individual adherends when the pressure-sensitive adhesive layer is heated to allow the heat-foaming agent to foam.

Such a pressure-sensitive adhesive tape is used, for example, in an electronic device such as a personal computer or mobile phone for bonding an internal power supply such as a battery for the electronic device with a housing or the like in which the internal power supply is accommodated.

CITATION LIST

Patent Literature

[PTL 1]
JP 2009-120808A

SUMMARY

Technical Problem

If a pressure-sensitive adhesive tape such as that disclosed in PTL 1 is used in an adhesion structure of an internal power supply of an electronic device and a housing for the internal power supply, there is a potential problem of inducing degradation of the internal power supply if the pressure-sensitive adhesive tape is heated at temperatures higher than product reliability guarantee conditions for the internal power supply upon separating the internal power supply from the housing. As a consequence, there has been a problem that such internal power supplies cannot be recycled. Such circumstances arise not only with adhesion structures in electronic devices, but also in situations where adherends, which may degrade depending on the environment temperature, are bonded with each other.

In view of such a problem, conventional pressure-sensitive adhesive tapes have been used solely in tacking applications upon premachining of electronic devices and the like that separation of components such as internal power supplies is conducted at temperatures equal to or lower than reliability guarantee conditions for the components.

Further, in a situation that a component having low temperature durability is to be bonded, it has been premised that the component is supposed to be disposed without recycling after separation of a pressure-sensitive adhesive tape.

The present technology, therefore, has as a primary object the provision of a technology that makes it possible to separate adherends with their recycling as a premise while meeting reliability guarantee temperature conditions for the adherends.

Solution to Problem

Specifically, the present technology provides a double-sided, pressure-sensitive adhesive tape including a pair of pressure-sensitive adhesive layers and an electrically-conductive heat generating layer disposed between the paired pressure-sensitive adhesive layers. At least one of the paired pressure-sensitive adhesive layers contains a heat-foaming agent, and at least one of opposite end faces of the electrically-conductive heat generating layer extends out beyond a corresponding end face of the at least one pressure-sensitive adhesive layer.

In this double-sided, pressure-sensitive adhesive tape, the heat-foaming agent may have a foaming starting temperature set higher than a guarantee temperature of an adherend to be bonded to the at least one pressure-sensitive adhesive layer, and the electrically-conductive heat generating layer may have a heat generating temperature set equal to or higher than the foaming starting temperature.

In this double-sided, pressure-sensitive adhesive tape, the opposite end faces of the electrically-conductive heat generating layer extend out beyond corresponding end faces of the at least one pressure-sensitive adhesive layer, and are disposed in the same planes as corresponding end faces of the other pressure-sensitive adhesive layer.

In this double-sided, pressure-sensitive adhesive tape, each pressure-sensitive adhesive layer may contain the heat-foaming agent.

Further, the present technology also provides an electronic device, which at least includes an internal power supply that drives the electronic device, an adherend bonded with the internal power supply, and a double-sided, pressure-sensitive adhesive tape bonding the internal power supply and the adherend with each other. The double-sided, pressure-sensitive adhesive tape includes a first pressure-sensitive adhesive layer bonded with the internal power supply, a second pressure-sensitive adhesive layer bonded with the adherend, and an electrically-conductive heat generating layer disposed between the first pressure-sensitive adhesive layer and the second pressure-sensitive adhesive layer. At least one of the first pressure-sensitive adhesive layer and the second pressure-sensitive adhesive layer contains a heat-foaming agent. At least one of opposite end faces of the electrically-conductive heat generating layer extends out beyond a corresponding end face of one of the first pressure-sensitive adhesive layer and the second pressure-sensitive adhesive layer.

In this electronic device, the heat-foaming agent contained in the double-sided, pressure-sensitive adhesive tape may have a foaming starting temperature set higher than a guarantee temperature of the internal power supply, the electrically-conductive heat generating layer may have a heat generating temperature set equal to or higher than the foaming starting temperature.

In this electronic device, the opposite end faces of the electrically-conductive heat generating layer may extend out beyond corresponding end faces of the second pressure-sensitive adhesive layer, and may be disposed in the same planes as corresponding end faces of the first pressure-sensitive adhesive layer.

In this electronic device, the first pressure-sensitive adhesive layer may contain the heat foaming agent.

In this electronic device, the first pressure-sensitive adhesive layer may be bonded with an inner wall of the internal power supply, the inner wall facing the adherend, and also with an outer wall of the internal power supply, the outer wall facing a cover that lies over the internal power supply.

This electronic device may further includes a switching element that supplies, to the electrically-conductive heat generating layer, electric energy which would otherwise be supplied from the internal power supply to the electronic device.

Furthermore, the present technology also provides a dismantlable structure including a double-sided, pressure-sensitive adhesive tape, and a combination of adherends bonded with each other via the double-sided, pressure-sensitive adhesive tape. The double-sided, pressure-sensitive adhesive tape includes a pair of pressure-sensitive adhesive layers and an electrically-conductive heat generating layer disposed between the paired pressure-sensitive adhesive layers. At least one of the paired pressure-sensitive adhesive layers contains a heat-foaming agent, and at least one of opposite end faces of the electrically-conductive heat generating layer extends out beyond a corresponding end face of the at least one pressure-sensitive adhesive layer. The combination of the adherends is dismantled by heating the at least one end face of the electrically-conductive heat generating layer and allowing the at least one pressure-sensitive adhesive layer, which contains the heat-foaming agent, to foam.

Still furthermore, the present technology also provides an adhesion structure including a first adherend, a second adherend, and an adhesion layer bonding the first adherend and the second adherend with each other. The adhesion layer has a self-dismantlable adhesion layer that is in contact with at least one of the first adherend and the second adherend.

In this adhesion structure, at least one of the first adherend and the second adherend may be provided with a heating tool insertion hole that extends to the self-dismantlable adhesion layer.

Advantageous Effects of Invention

According to the present technology, an adherend can be separated with its recycling as a premise while meeting its reliability guarantee temperature conditions.

It is to be noted that the advantageous effects described herein are not necessarily brought about in full combination but may be brought about separately or in selected combinations.

DESCRIPTION OF EMBODIMENTS

Figure 1:
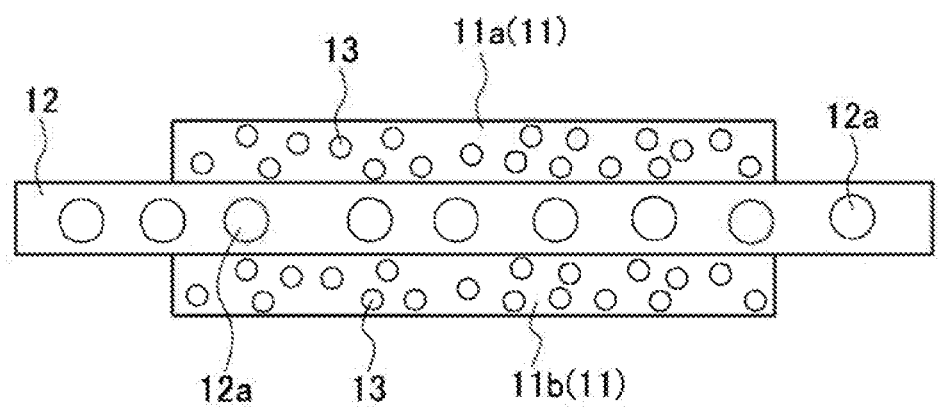
FIG. 1 is a simplified conceptual diagram schematically illustrating a first embodiment of the double-sided, pressure-sensitive adhesive tape according to the present technology.

With reference to the drawings, a description will hereinafter be made about preferred embodiments for practicing the present technology. It is to be noted that the following embodiments illustrate examples of representative embodiments of the present technology and shall not be interpreted to restrict the scope of the present technology. The description will be made in the following order.

1. Double-sided, Pressure-Sensitive Adhesive Tape 1
   (1) Pressure-sensitive layers 11
   (2) Heat-foaming agent 13
   (3) Electrically-conductive heat generating layer 12
   (4) Adherends
2. Electronic Devices 101
   (1) Internal power supply 102
   (2) Adherend 103
   (3) Double-sided, pressure-sensitive adhesive tape 104

(4) Drive circuit 105
(5) Switching element 106
(6) Evaluations of double-sided, pressure-sensitive adhesive tape
3. Dismantlable Structure
4. Adhesion Structure
(1) First adherend 201 and second adherend 202
(2) Adhesive layer 203
(3) Heating tool or tools 204
1. Double-Sided, Pressure-sensitive Adhesive Tape 1

FIG. 1 is a simplified conceptual diagram schematically illustrating the concept of a double-sided, pressure-sensitive adhesive tape 1 (which may hereinafter be also called the "pressure-sensitive adhesive tape 1") according to the present technology. The double-sided, pressure-sensitive adhesive tape 1 according to the present technology is used to bond a combination of adherends with each other, and when heated, generates heat and separates from the adherends, and includes at least a pair of pressure-sensitive adhesive layers 11 and an electrically-conductive, heat generating layer 12 disposed between the paired pressure-sensitive adhesive layers 11. A description will hereinafter be made in detail about the individual layers.

(1) Pressure-Sensitive Adhesive Layers 11

The pressure-sensitive adhesive tape 1 according to the present technology includes the paired pressure-sensitive adhesive layers 11 to be bonded to adherends, for example, such as an internal power supply like a battery built in an electronic device and a housing or the like in which the internal power supply is accommodated.

The pressure-sensitive adhesive tape 1 according to the present technology includes a first pressure-sensitive adhesive layer 11*a* and a second pressure-sensitive adhesive layer 11*b*, which are to be disposed between the combined adherends. The first pressure-sensitive adhesive layer 11*a* is to be bonded to one of the adherends, while the second pressure-sensitive adhesive layer 11*b* is to be bonded to the other adherend.

For the formation of the respective pressure-sensitive adhesive layers 11*a* and 11*b*, it is possible to employ a known material commonly used in producing double-sided, pressure-sensitive adhesive tapes. Examples may include acrylic pressure-sensitive adhesives such as those containing an alkyl (meth)acrylate as a main component. In the pressure-sensitive adhesive tape 1 according to the present technology, the use of a thermoplastic pressure-sensitive adhesive is preferred from the viewpoint of separation by heating.

No particular limitation is imposed on the thickness of the pressure-sensitive adhesive layers 11*a* and 11*b*, and the thickness of the pressure-sensitive adhesive layers 11*a* and 11*b* can be chosen as desired according to the arrangement environment of adherends to be bonded with each other by the pressure-sensitive adhesive tape 1 according to the present technology. To shorten the time required for the separation of the pressure-sensitive adhesive tape 1 according to the present technology from the adherend, however, its lower limit may be preferably 30 μm or greater, more preferably 100 μm or greater. Its upper limit may be preferably 500 μm or smaller, more preferably 300 μm or smaller.

(2) Heat-Foaming Agent 13

In the double-sided, pressure-sensitive adhesive tape 1 according to the present technology, the pressure-sensitive adhesive layers 11 contain a heat-foaming agent 13. This heat-foaming agent 13 is induced to foam by heating, whereby the pressure-sensitive adhesive tape 1 can separate from the adherends. When heated, the foamed heat-foaming agent 13 also functions as a heat insulator, and prevents heat from propagating from the pressure-sensitive adhesive layers 11 to the adherends.

In the pressure-sensitive adhesive tape 1 according to the present technology, the heat-foaming agent 13 may preferably be contained in at least one of the paired pressure-sensitive adhesive layers 11. In the pressure-sensitive adhesive tape 1 illustrated in FIG. 1, an example that the heat-foaming agent 13 is contained in the respective pressure-sensitive adhesive layers 11*a* and 11*b*. If the heat-foaming agent 13 is incorporated in one of the paired pressure-sensitive adhesive layers 11*a* and 11*b*, it is preferred to incorporate the heat-foaming agent 13 in the pressure-sensitive adhesive layer 11 to be bonded to the adherend the separation of which is desired positively.

As the heat-foaming agent 13, no particular limitation is imposed. For example, a known heat-foaming agent can be chosen and used as desired. Examples may include microencapsulated foaming agents, and various inorganic foaming agents and organic foaming agents. Examples of microencapsulated foaming agents may include those which contain liquefied hydrocarbon or the like filled in microcapsules made of polyvinyl chloride, polyvinylidene or the like and induce the liquefied hydrocarbon to readily gasify and expand when heated. On the other hand, representative examples of the inorganic foaming agents include ammonium carbonate, ammonium hydrogen carbonate, sodium hydrogen carbonate, and the like, and representative examples of the organic foaming agents include chlorofluorinated alkanes such as dichloromonofluoromethane, azo compounds such as azobisisobutyronitrile, and the like. For the pressure-sensitive adhesive tape 1 according to the present technology, a microencapsulated foaming agent is preferred as the heat-foaming agent 13 because heat can be prevented from propagating to the adherends bonded with each other by the pressure-sensitive adhesive tape 1 owing to the expanded heat-foaming agent 13.

The heat-foaming agent 13 may preferably have a foaming starting temperature set higher than temperatures under product reliability guarantee conditions (hereinafter called the "guarantee temperatures") for the adherends to be bonded by the pressure-sensitive adhesive tape 1 according to the present technology.

In addition, the foaming starting temperature of the heat-foaming agent 13 may preferably be set at as low a temperature as possible while ensuring a tolerance with the guarantee temperatures of the adherends because the foamed heat-foaming agent 13 is required to function as a heat insulator while assuring to meet the product reliability guarantee conditions for the adherends.

More specifically, the foaming starting temperature of the heat-foaming agent 13 may preferably be set higher in a range of 10° C. to 50° C., may more preferably be set higher in a range of 10° C. to 30° C. than the guarantee temperature of the adherend. In this numerical range, it may be preferred to set the foaming starting temperature of the heat-foaming agent 13 at 100° C. if the guarantee temperature of the adherend is assumed to be 85° C.

(3) Electrically-Conductive Heat Generating Layer 12

The pressure-sensitive adhesive tape 1 according to the present technology includes the electrically-conductive heat generating layer 12 between the paired pressure-sensitive adhesive layers 11. In the pressure-sensitive adhesive tape 1 according to the present technology, by heating the electrically-conductive heat generating layer 12 to generate heat, the heat propagates to the pressure-sensitive adhesive layers 11 so that the heat-foaming agent 13 is induced to foam. As a result, the pressure-sensitive adhesive layers 11 and the adherends readily separate at their interfaces.

As illustrated in FIG. 1, in the pressure-sensitive adhesive tape 1 according to the present technology, the electrically-conductive heat generating layer 12 has a length in a longitudinal direction (in the horizontal direction on the sheet of FIG. 1), which is set greater than the lengths of the respective pressure-sensitive adhesive layers 11a and 11b in longitudinal directions thereof.

In other words, longitudinally opposite end faces of the electrically-conductive heat generating layer 12 are configured to extend out beyond corresponding, longitudinally opposite end faces of the respective pressure-sensitive adhesive layers 11a and 11b, and the outwardly-extending end portions of the electrically-conductive heat generating layer 12 are configured to be exposed to an external atmosphere at front and back sides thereof, which face in a direction perpendicular to the longitudinal direction.

Figure 2:
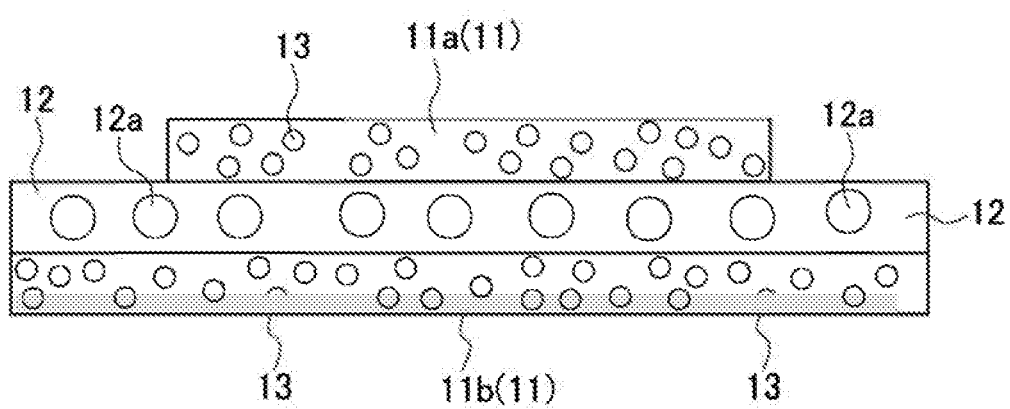
FIG. 2 is a simplified conceptual diagram schematically illustrating a second embodiment of the double-sided, pressure-sensitive adhesive tape according to the present technology.

In the pressure-sensitive adhesive tape 1 illustrated in FIG. 1, the opposite end faces of the electrically-conductive heat generating layer 12 are configured to extend out beyond the corresponding end faces of the respective pressure-sensitive adhesive layers 11a and 11b. However, the configuration of the pressure-sensitive adhesive tape 1 according to the present technology is not limited to such a configuration. No problem arises, for example, if the pressure-sensitive adhesive tape 1 according to the present technology is configured such that as illustrated in FIG. 2, the longitudinal length of the electrically-conductive heat generating layer 12 is set equal to the longitudinal length of the second pressure-sensitive adhesive layer 11b and the opposite end faces of the electrically-conductive heat generating layer 12 are disposed in the same planes as the corresponding opposite end faces of the pressure-sensitive adhesive layer 11b but extend out beyond the corresponding end faces of the first pressure-sensitive adhesive layer 11a.

Examples of the electrically-conductive heat generating layer 12 may include, but are not particularly limited to, metal films, resin films with an electrically-conductive member 12a included therein, and the like. Examples of the electrically-conductive member 12a may include electrically-heating wires, metal foils, carbon nanotubes, carbon powder, metal powder, and the like. As metals that form the metal foils and metal powder, aluminum, copper and the like are preferred for their good electrical conductivity. As the electrically-heating wires, metal wires having high electrical resistance, such as Nichrome wire (metal wire of nickel-chromium alloy) and metal wires of iron-chromium alloys, are preferred.

A heating method of the electrically-conductive heat generating layer 12 can be, but is not particularly limited to, a method that electric energy is directly supplied with a connector such as an alligator clip or a contact pin, a method that uses electromagnetic induction by radio-frequency waves, or the like. If the pressure-sensitive adhesive tape 1 according to the present technology has been applied to an electronic device, there is also a method that electric energy is directly supplied from the internal power supply of the electronic device to the electrically-conductive heat generating layer 12 to heat the electrically-conductive heat generating layer 12.

The heat generating temperature of the electrically-conductive heat generating layer 12 may preferably be set equal to or higher than the foaming starting temperature of the heat-foaming agent 13. In the pressure-sensitive adhesive tape 1 according to the present technology, there is a need to induce foaming of the heat-foaming agent 13, which is contained in the pressure-sensitive layers 11, by allowing the heat of the electrically-conductive heat generating layer 12 to propagate to the pressure-sensitive adhesive layers 11.

To ensure the foaming of the heat-foaming agent 13, the heat generating temperature of the electrically-conductive heat generating layer 12 may be set higher preferably in a range of 10° C. to 50° C., more preferably in a range of 10° C. to 30° C. than the foaming starting temperature of the heat-foaming agent 13. Setting of the heat generating temperature for the electrically-conductive heat generating layer 12 at a temperature higher than the above-described range is not preferred because, when the electrically-conductive heat generating layer 12 is induced to generate heat, the temperature of the whole pressure-sensitive adhesive tape 1 may exceed the guarantee temperatures of the adherends and quality degradation of the adherends may be induced. It is to be noted that the thickness of the electrically-conductive heat generating layer 12 is not particularly limited and may be chosen as desired according to the arrangement environment of the adherends to be adhered with each other by the pressure-sensitive adhesive tape 1 according to the present technology.

(4) Adherends

No particular limitation is imposed on adherends to which the present technology can be applied, insofar as they can be bonded by a double-sided, pressure-sensitive adhesive tape such as the pressure-sensitive adhesive tape 1 according to the present technology. Examples of a combination of adherends are considered to include fastening portions or the like of components and devices which are worthy to be recycled in view of cost and environmental aspects, such as a combination of an internal power supply such as a battery and a housing or board of an electronic device such as a personal computer or mobile phone, the housing or board being in contact with the internal power supply, a combination of an optical device and a lens or prism, a combination of a liquid crystal screen and a housing, a combination of a housing or a liquid crystal screen or board and a flexible wiring board, and a combination of a board or housing and a film antenna, in the electronic device.

The pressure-sensitive adhesive tape 1 according to the present technology as described above is used to bond a combination of adherends with each other.

If it is desired to separate the bonded adherends from each other for recycling or for repair, the electrically-conductive heat generating layer 12 is heated at its end portions extending out beyond the opposite ends of the pressure-sensitive adhesive layers 11 so that the electrically-conductive heat generating layer 12 is induced to generate heat. As a consequence, such heat of the electrically-conductive heat generating layer 12 propagates to the pressure-sensitive adhesive layers 11, and the heat-foaming agent 13 contained in the pressure-sensitive adhesive layers 11 is induced to foam. As a result, the pressure-sensitive adhesive layers 11 and the associated adherends can separate from each other at the interfaces between them, or the area of contact of each pressure-sensitive adhesive layer 11 and its associated adherend can be made smaller. Accordingly, the propagation of heat to the adherends can be inhibited to stop temperature rises of the adherends so that quality degradation of the adherends can be avoided.

In the pressure-sensitive adhesive tape 1 according to the present technology, the heat generating temperature of the electrically-conductive heat generating layer 12 is set equal to or higher than the foaming starting temperature of the heat-foaming agent 13, and moreover, the foaming starting temperature of the heat-foaming agent 13 is set higher than the guarantee temperature of the adherend. By heating the electrically-conductive heat generating layer 12, the heat-foaming agent 13 contained in the associated pressure-sensitive adhesive layer 11 can be induced to foam for sure, whereby the pressure-sensitive adhesive layer 11 and the associated adherend can separate from each other at the interface between them, or the area of contact of the pressure-sensitive adhesive layer 11 and its associated adherend can be made smaller.

Although the foaming starting temperature of the heat-foaming agent 13 is set higher than the guarantee temperature of the adherend, the heat-foaming agent 13 is induced to foam owing to the generation of heat in the electrically-conductive heat generating layer 12 and the propagation of the heat to the pressure-sensitive adhesive layer 11. Therefore, the foamed heat-foaming agent 13 functions as a heat insulator before the temperature of the adherend rises to the guarantee temperature or higher. As a result, it is possible to stop a temperature rise of the adherend, and hence to avoid performance degradation of the adherend.

If the adherend is a component made of metal, for example, the production of the pressure-sensitive adhesive tape 1 according to the present technology in the form illustrated in FIG. 2 can avoid development of short-circuiting through adhesion of the electrically-conductive heat generating layer 12 with the adherend as the metal component upon directly supplying electric energy to the electrically-conducive heat generating layer 12 with a connector such as a contact pin to generate heat.

2. Electronic Devices 101

Using FIG. 3 and FIG. 4, a description will next be made about electronic devices to which the present technology has been applied. Electronic devices 101 illustrated in FIGS. 3 and 4 each include at least an internal power supply 102 for driving the electronic device 101, an adherend 103 to which the internal power supply 102 is bonded, and a double-sided, pressure-sensitive adhesive tape 104 bonding the internal power supply 102 and the adherend 103 with each other. Each electronic device 101 according to the present technology may further include, as needed, a drive circuit 105 for the electronic device 101, a switching element 106 for supplying electric energy of the internal power supply 102 to the drive circuit 105 or double-sided, pressure-sensitive adhesive tape 104, and a cover that lies over the internal power supply 102 in a state that the internal power supply 102 is accommodated in the adherend 103. The drive circuit 105 and the switching element 106 will be described subsequently herein using FIG. 8.

No particular limitation is imposed on electronic devices 101 to which the present technology can be applied, and known electronic devices can be mentioned. Illustrative are note-type personal computers, portable digital assistants (PDAs) (portable information terminal), mobile phones, cordless telephone extensions, video movie cameras and players, digital still cameras, digital books, electronic dictionaries, music players, radios, head phones, game consoles, navigation systems, memory cards, pace makers, hearing aids, electric tools, electric shavers, refrigerators, air conditioners, TV sets, stereo audio systems, hot water dispensers, microwave ovens, dish washers, washing machines, laundry dryers, lighting equipment, toys, medical equipment, robots, load conditioners, traffic lights, and the like.

(1) Internal Power Supply 102

The internal power supply 102 included in each electronic device 101 according to the present technology is a battery that serves as a drive source for the electronic device 101. No particular limitation is imposed on the type of the battery. Illustrative are primary batteries such as dry cells, secondary batteries such as lithium ion secondary batteries and lithium ion polymer secondary batteries, and the like.

(2) Adherend 103

The adherend 103 included in each electronic device 101 according to the present technology is bonded to the internal power supply 102 via the double-sided, pressure-sensitive adhesive tape 104. Illustrative are a housing in which the internal power supply 102 is fitted and which serves as a frame of the electronic device 101, a board which is kept in contact with the internal power supply 102, and the like.

(3) Double-Sided, Pressure-Sensitive Adhesive Tape 104

The double-sided, pressure-sensitive adhesive tape 104 included in each electronic device 101 according to the present technology includes a first pressure-sensitive adhesive layer 111a bonded with the internal power supply 102, a second pressure-sensitive adhesive layer 111b bonded with the adherend 103, and an electrically-conductive heat generating layer 112 held between the first pressure-sensitive adhesive layer 111a and the second pressure-sensitive adhesive layer 111b.

The basic configurations of the first pressure-sensitive adhesive layer 111a and second pressure-sensitive adhesive layer 111b are the same as those of the pressure-sensitive adhesive layers 11 included in the pressure-sensitive adhesive tapes 1 according to the present technology, and therefore their description is omitted here.

In each electronic device 101 according to the present technology, on the other hand, a heat-foaming agent 113 is required to be contained in at least one of the first pressure-sensitive adhesive layer 111a and second pressure-sensitive adhesive layer 111b. Taking into consideration the avoidance of quality deterioration or the like of the internal power supply 102, the heat-foaming agent 113 may be contained preferably in the first pressure-sensitive adhesive layer 111a bonded with the internal power supply 102.

The foaming starting temperature of the heat-foaming agent 113 may preferably be set higher than the guarantee temperature of the internal power supply 102. In addition, the foaming starting temperature of the heat-foaming agent 113 may preferably be set at as low a temperature as possible while ensuring a tolerance with the guarantee temperature of the internal power supply 102 because the foamed heat-foaming agent 113 is required to function as a heat insulator while assuring to meet the product reliability guarantee conditions for the internal power supply 102.

The basic configuration of the electrically-conductive heat generating layer 112 is the same as that of the electrically-conductive heat generating layer 12 included in the pressure-sensitive adhesive tapes 1 according to the present technology, and therefore their description is omitted here.

Further, the electrically-conductive heat generating layer 112 may also contain an electrically-conductive member 112a. This electrically-conductive member 112a is the same as the electrically-conductive member 12a included in the electrically-conductive heat generating layer 12, and therefore its description is omitted here.

On the other hand, the heat generating temperature of the electrically-conductive heat generating layer 112 may preferably be set equal to or higher than the foaming starting temperature of the heat-foaming agent 113.

Figure 3:
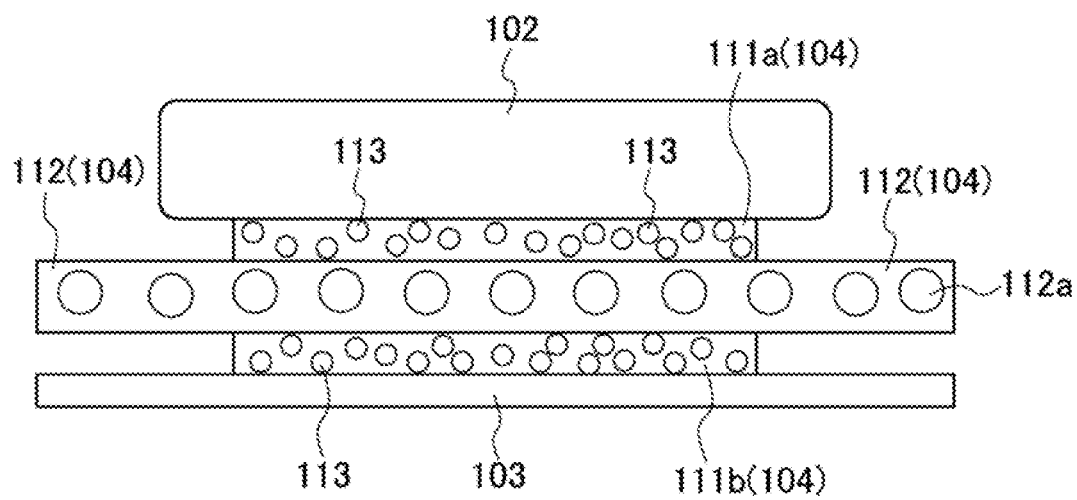
FIG. 3 is a simplified conceptual diagram schematically illustrating a first embodiment of the electronic device according to the present technology.

Each double-sided, pressure-sensitive adhesive tape 104 according to the present technology as described above is used in such a manner that, as illustrated in FIG. 3, the double-sided, pressure-sensitive adhesive tape 104 is disposed between the internal power supply 102 and the adherend 103, the first pressure-sensitive adhesive layer 111a is bonded to the internal power supply 102, and the second pressure-sensitive adhesive layer 111b is bonded to the adherend 103. At this time, the opposite end faces of the electrically-conductive heat generating layer 112 are in a state that they extend out beyond the corresponding end faces of the respective pressure-sensitive adhesive layers 111a and 111b, and the front side and back side of the electrically-conductive heat generating layer 112, the front side and back side facing in the direction perpendicular to the longitudinal direction, face the internal power supply 102 and the adherent 103, respectively.

Figure 4:
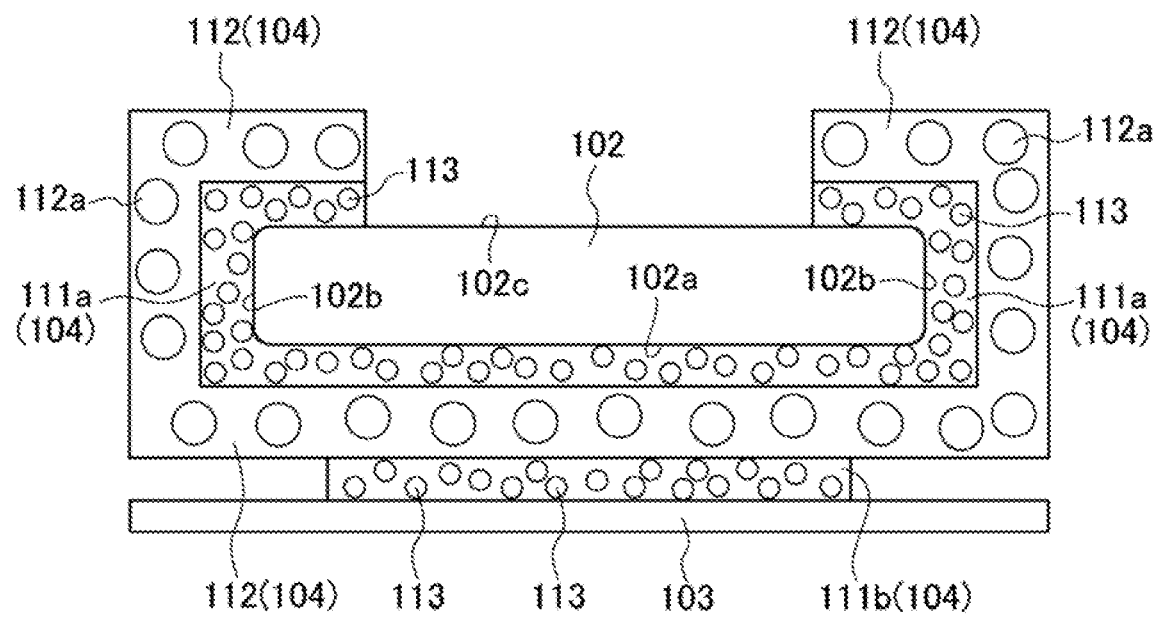
FIG. 4 is a simplified conceptual diagram schematically illustrating a second embodiment of the electronic device according to the present technology.

On the other hand, the double-sided, pressure-sensitive adhesive tape 104 included in each electronic device 101 according to the present technology may be configured without problem such that, as illustrated in FIG. 4, the longitudinal length of the electrically-conductive heat generating layer 112 is set equal to the longitudinal length of the first pressure-sensitive adhesive layer 111a, and the opposite end faces of the electrically-conductive heat generating layer 112 are disposed in the same planes as the corresponding end faces of the first pressure-sensitive adhesive layer 111a but extend out beyond the corresponding end faces of the second pressure-sensitive adhesive layer 111b. In this form, the double-sided, pressure-sensitive adhesive tape 104 may preferably be configured so that the first pressure-sensitive adhesive layer 111a is bonded with an inner wall 102a of the internal power supply 102, the inner wall facing the adherend 103, parts of opposite side walls 102b of the internal power supply 102, and an outer wall 102c of the internal power supply 102, the outer wall 102c facing the cover. In this form, the longitudinal length of the electrically-conductive heat generating layer 112 is set equal to the longitudinal length of the first pressure-sensitive adhesive layer 111a. Therefore, the electrically-conductive heat generating layer 112 is bent covering the inner wall 102a, opposite side walls 102b and outer wall 102c of the internal power supply 102, and is exposed on the side of the outer wall 102c of the internal power supply 102.

Using FIGS. 5 to 7, a description will next be made about disposition examples upon applying one or two double-sided, pressure-sensitive adhesive tapes 104, which are configured as described above, to an electronic device 101.

Figure 5:
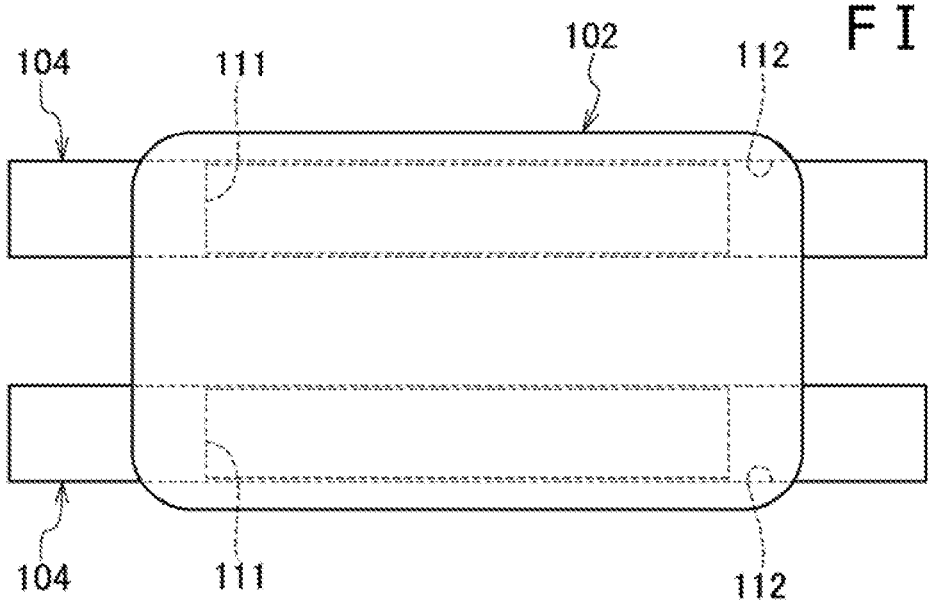
FIG. 5 is a simplified conceptual diagram illustrating an example of a layout of double-sided, pressure-sensitive adhesive tapes according to the present technology as applied to an internal power supply that is included in the electronic device.

As illustrated in FIG. 5, two double-sided, pressure-sensitive adhesive tapes 104 can be bonded along the longitudinal direction of the internal power supply 102, and can be disposed in parallel to each other.

Figure 6:
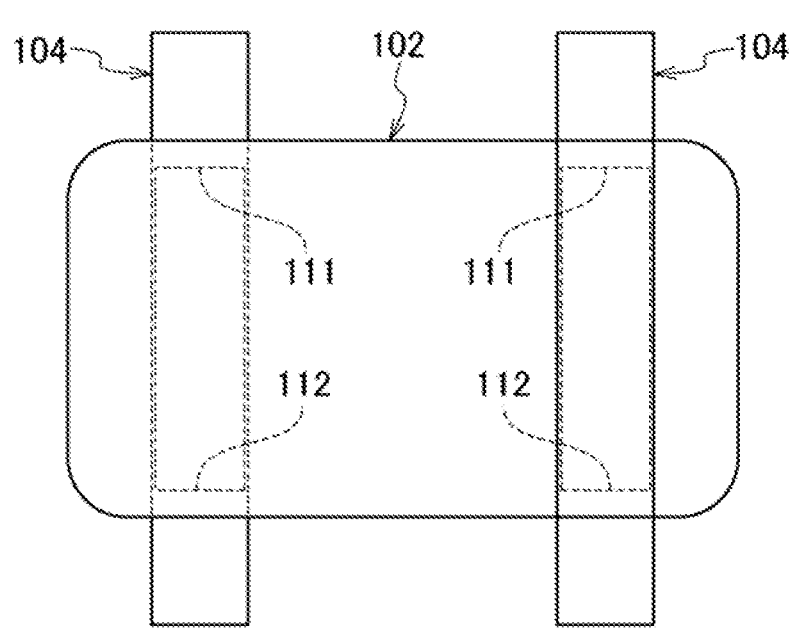
FIG. 6 is a simplified conceptual diagram illustrating another example of the layout of the double-sided, pressure-sensitive adhesive tapes according to the present technology as applied to the internal power supply that is included in the electronic device.
Figure 7:
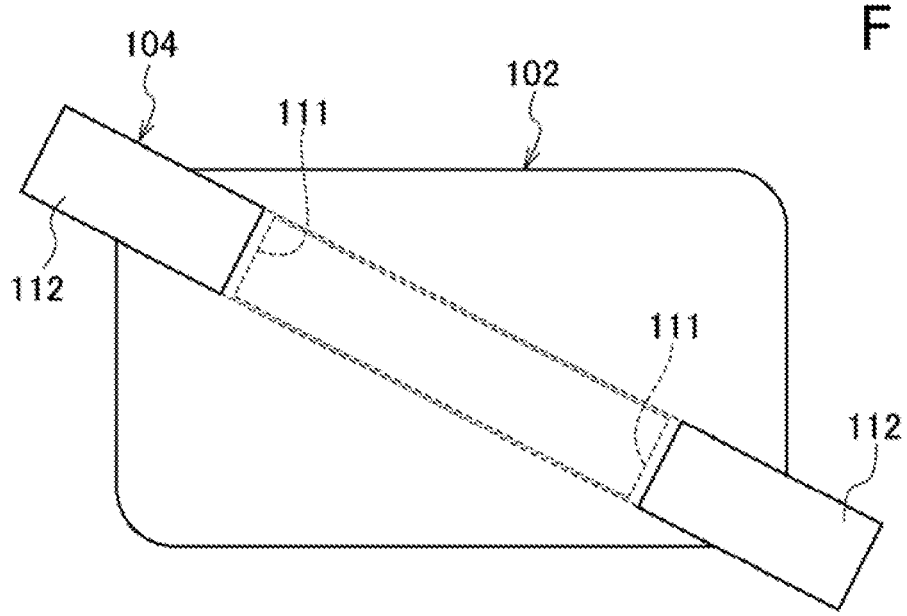
FIG. 7 is a simplified conceptual diagram illustrating an example of a layout of a double-sided, pressure-sensitive adhesive tape according to the present technology as applied to the internal power supply that is included in the electronic device.

Further, as illustrated in FIG. 6, two double-sided, pressure-sensitive adhesive tapes 104 can be bonded in a direction perpendicular to the longitudinal direction of the internal power supply 102, and can be disposed in parallel to each other. Furthermore, as illustrated in FIG. 7, a double-sided, pressure-sensitive adhesive tape 104 can be bonded obliquely to the longitudinal direction of the internal power supply 102. Here, the double-sided, pressure-sensitive adhesive tape 104 illustrated in FIG. 7 has the form illustrated in FIG. 4, and the electrically-conductive heat generating layer 112 is exposed on the side of the outer wall 102c of the internal power supply 102.

(4) Drive Circuit 105

Figure 8:
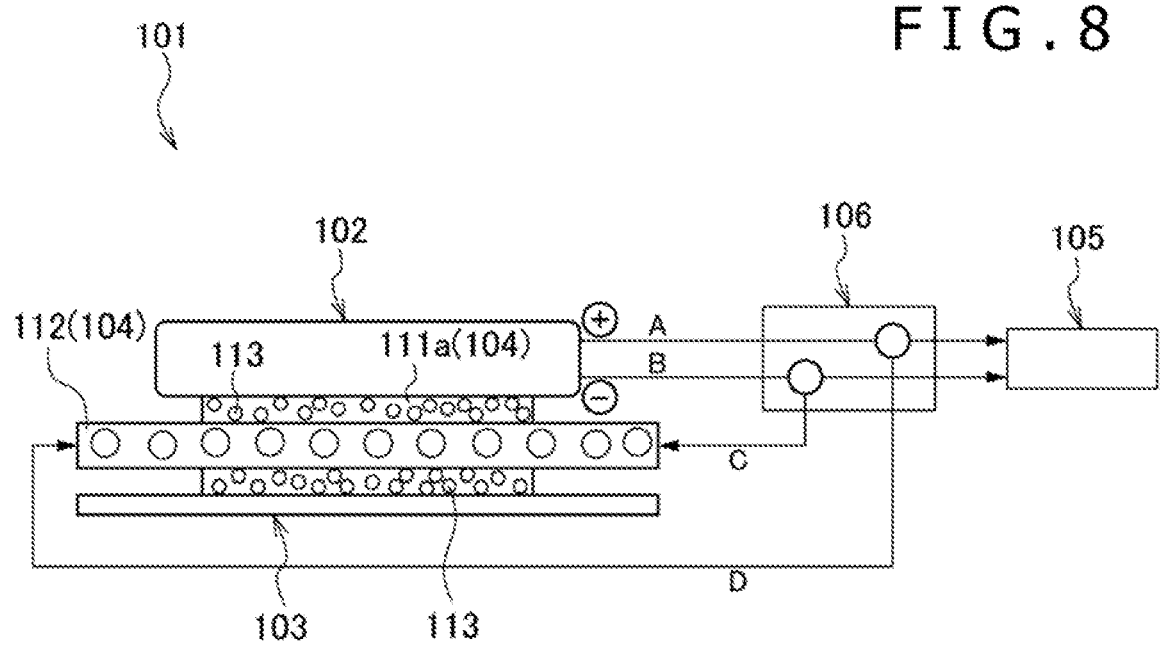
FIG. 8 is a simplified conceptual diagram illustrating a first modification of the electronic device of FIG. 3.

As illustrated in FIG. 8, the electronic device 101 according to the present technology may include the drive circuit 105 for driving the electronic device 101. The drive circuit 105 is a general drive circuit suitable for being mounted on electronic devices 101, and as its configuration, a known configuration can be adopted.

(5) Switching Element 106

As illustrated in FIG. 8, the electronic device 101 according to the present technology may include a switching element 106 that switches the supply destination of electric energy stored in the internal power supply 102. This switching element 106 is configured so that upon driving the electronic device 101, the electric energy of the internal power supply 102 can be supplied to the drive circuit 105 (arrows A and B). The switching element 106 is also configured so that, when desired to separate the internal power supply 102 from the adherend 103 on the other hand, the electric energy of the internal power supply 102 can be supplied to the electrically-conductive heat generating layer 112 of the double-sided, pressure-sensitive adhesive tape 104 (arrows C and D).

No particular limitation is imposed on the configuration of the switching element 106, and a known configuration that is used upon switching the supply destination of electric energy on a circuit board can be applied. Illustrative are mechanical switches such as slide switches and push switches.

As an alternative configuration, short lands may be provided at an area of a board pattern, the area forming the switching element 106. Upon driving the electronic device 101, a short circuit is created with solder at the short land on the side of the drive circuit 105, whereby the electric energy is supplied. Upon removing the internal power supply 102, the solder at the short land on the side of the drive circuit 105 is removed, and soldering is applied to the short land on the side of the electrically-conductive heat generating layer 112.

As another alternative configuration, a terminal and a connector may be provided for use upon driving of the electronic device 101, and another terminal and another connector may be provided for use upon separation of the internal power supply 102. A destination of connection on a flexible wiring board or in a harness from the internal power supply 102 is changed.

(6) Evaluations of Double-Sided Pressure-Sensitive Adhesive Tape

By manufacturing an electronic device including a pair of pressure-sensitive adhesive layers and a double-sided, pressure-sensitive adhesive tape with an electrically-conductive heat generating layer disposed between a pair of pressure-sensitive adhesive layers and heating the electrically-conductive heat generating layer, the inventor of the present technology conducted an evaluation as to whether the double-sided, pressure-sensitive adhesive tape would separate from an adherend. Further, another evaluation was also conducted as to whether heat of the electrically-conductive heat generating layer would propagate to the adherend via the associated pressure-sensitive adhesive layer.

As the double-sided, pressure-sensitive adhesive tape, a double-sided, pressure-sensitive adhesive tape was produced using, as a heat-foaming agent, one having a foaming starting temperature of 100° C. and incorporating it in respective pressure-sensitive adhesive layers.

In addition, a battery that was an internal power supply of the electronic device was used as the adherend, and a copper-made board was used as another adherend. It is to be noted that the guarantee temperature of the battery was 85° C.

Two thermocouples were disposed, one at an interface between the battery and the associated pressure-sensitive adhesive layer and the other at an interface between the associated pressure-sensitive adhesive layer and the electrically-conductive heat generating layer, and temperature variations at the respective interfaces were measured with the passage of heating time.

Figure 10:
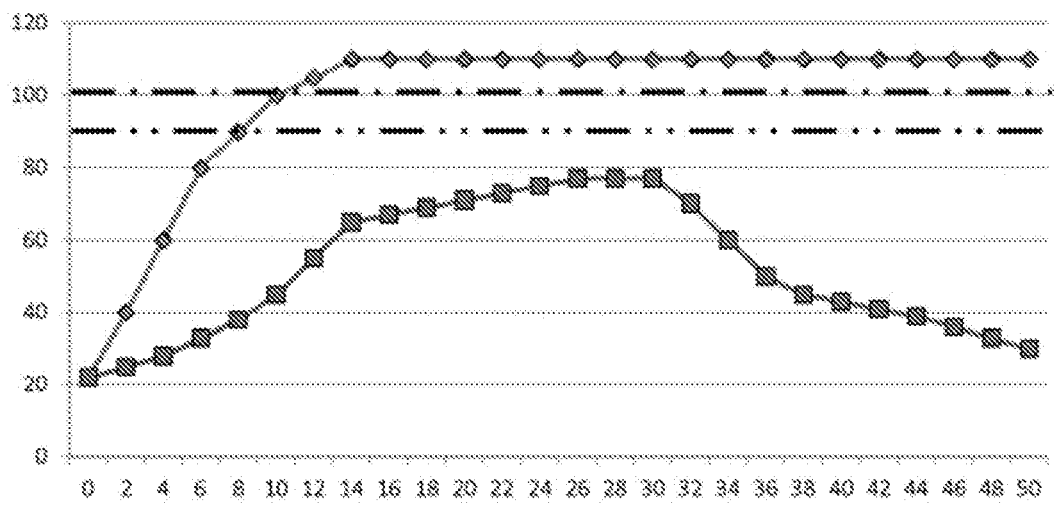
FIG. 10 is a diagram as a substitute for a graph, which illustrates evaluation results of a double-sided, pressure-sensitive adhesive tape according to the present technology.

Measurement results are illustrated in FIG. 10. In FIG. 10, the axis of ordinates represents temperatures, while the axis of abscissas represents electrical heating time (second). In FIG. 10, the one-dot-dash line represents the foaming starting temperature of the heat-foaming agent, and the two-dot-dash line represents the guarantee temperature of the battery. Further, the square plots represent temperatures at the interface between the battery and the associated pressure-sensitive adhesive layer, while the rhombic plots represent temperatures at the interface between the associated pressure-sensitive adhesive layer and the electrically-conductive heat generating layer.

As demonstrated in FIG. 10, the temperature at the interface between the battery and the associated pressure-sensitive adhesive layer remained below the guarantee temperature 85° C. of the battery even after the electrically-conductive heat generating layer was heated and the temperature at the interface between the associated pressure-sensitive adhesive layer and the electrically-conductive heat generating layer became higher than the foaming starting temperature 100° C. of the heat-foaming agent. Therefore, it has been confirmed that with the double-sided, pressure-sensitive adhesive tape according to the present technology, the battery can be separated from the copper-made board in a state that the temperature of the battery is lower than the foaming starting temperature of the heat-foaming agent. In addition, it has also been confirmed that the heat-foaming agent contained in the associated pressure-sensitive adhesive layer functions as a heat insulator and the heat propagated from the electrically-conductive heat generating layer to the associated pressure-sensitive adhesive layer does not propagate to the battery.

According to the electronic device 101 of the present technology as described above, when it is desired to separate the internal power supply 102 from the adherend 103, heating of the electrically-conductive heat generating layer 112 at an end portion thereof extending out beyond at least one of the opposite end faces of the associated pressure-sensitive adhesive layer 111 induces the electrically-conductive heat generating layer 112 to generate heat. Consequently, the heat of the electrically-conductive heat generating layer 112 propagates to the associated pressure-sensitive adhesive layer 111, whereby the heat-foaming agent 113 contained in the associated pressure-sensitive adhesive layer 111 is induced to foam.

Hence, the internal power supply 102 and the associated pressure-sensitive adhesive layer 111 can separate from each other at the interface thereof, or the area of contact of the internal power supply 102 with the associated pressure-sensitive adhesive layer 111 can be made smaller. Further, owing to the foaming of the heat-foaming agent 113, it is possible to prevent the heat of the electrically-conductive heat generating layer 112 from propagating to the internal power supply 102.

As a result, upon separation of the internal power supply 102 from the adherend 103, the temperature rise of the internal power supply 102 can be stopped, and therefore, the quality degradation of the internal power supply 102 can be avoided.

According to the electronic device 101 of the present technology, the inclusion of the switching element 106 can obviate the need for supplying electric energy from the outside of the electronic device 101, and can manufacture the electronic device 101 in a simpler configuration accordingly.

Figure 9:
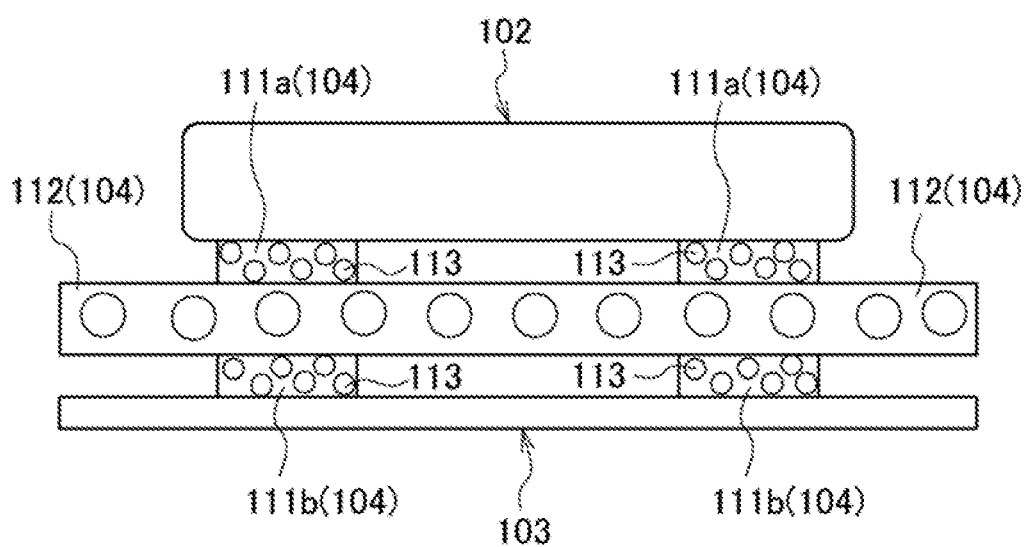
FIG. 9 is a simplified conceptual diagram illustrating a second modification of the electronic device of FIG. 3.

The double-sided, pressure-sensitive adhesive tape 104 illustrated in each of FIG. 3 and FIG. 4 is in the form that one pressure-sensitive adhesive layer 111 is disposed on each surface of the electrically-conductive pressure-sensitive layer 112. However, no limitation is imposed on the number of pressure-sensitive adhesive layer(s) 111 on each surface of the electrically-conductive pressure-sensitive layer 112, and a plurality of pressure-sensitive adhesive layers 111 may be disposed on each surface of the electrically-conductive pressure-sensitive layer 112. As illustrated in FIG. 9, for example, the double-sided, pressure-sensitive adhesive tape 104 may be configured without problem to include two pressure-sensitive adhesive layers 111 on each surface of the electrically-conductive pressure-sensitive layer 112.

3. Dismantlable Structure

The present technology also provides a structure for dismantling a bonded combination of adherends from each other. This dismantlable structure includes a double-sided, pressure-sensitive adhesive tape, and the combination of adherends bonded with each other via the double-sided, pressure-sensitive adhesive tape.

The double-sided, pressure-sensitive adhesive tape includes a pair of pressure-sensitive adhesive layers, and an electrically-conductive heat generating layer disposed between the paired pressure-sensitive adhesive layers. At least one of the paired pressure-sensitive adhesive layers contains a heat-foaming agent. At least one of opposite end faces of the electrically-conductive heat generating layer extends out beyond the corresponding end face of the at least one pressure-sensitive adhesive layer.

With the dismantlable structure according to the present technology, heating of at least one end face of the electrically-conductive heat generating layer induces foaming and expansion of the at least one pressure-sensitive adhesive layer which contains the heat-foaming agent, so that the combination of adherends can be dismantled.

The configuration of the double-sided, pressure-sensitive adhesive tape included in the dismantlable structure according to the present technology is the same as the configuration of the above-mentioned double-sided, pressure-sensitive adhesive tapes 1, and therefore its description is omitted here. Further, the adherends included in the dismantlable structure according to the present technology are the same as the adherends for which the above-mentioned double-sided, pressure-sensitive adhesive tapes 1 are used, and therefore their description is omitted here.

4. Adhesion Structure

In an adhesion structure of a first adherend and a second adherend bonded with each other, means for heating the entire adhesion structure by using a constant-temperature chamber or a dryer has conventionally be adopted upon separating the first adherend or the second adherend.

In recent years, there is a tendency of growing demand for recycling regenerated resources. From electronic devices and the like including, as adherents, internal power supplies such as batteries and cover glasses that form image display screens, the batteries, cover glasses and the like are dismantled and recovered as individual components.

Such conventional heating means, however, involve a problem in that the first adherend and/or the second adherend is damaged by the heating and cannot be recycled.

The present technology also provides a structure having an adhesion layer, which bonds a first adherend and a second adherend with each other and enables separation of the first adherend and/or the second adherend without damaging the first adherend and/or the second adherend.

Using FIG. 11 through FIG. 16, a description will hereinafter be made about this adhesion structure. The adhesion structure includes at least a first adherend 201, a second adherend 202 bonded with the first adherend, and an adhesion layer 203 bonding the first adherend 201 and the second adherend 202 with each other. This adhesion structure may also include, as needed, one or more heating tools 204 for separating the adhesion layer 203 from the first adherend 201 or the second adherend 202.

(1) First Adherend 201 and Second Adherend 202

As the first adherend 201 and the second adherend 202 in the present technology, no particular limitation is imposed, and known adherends can be used. Examples of the combination of the first adherend 201 and the second adherend 202 include a combination of a housing as a frame of a mobile phone and a cover glass stacked on the housing and forming the image display screen of the mobile phone, a bonded combination of housings, a bonded combination of a liquid crystal display screen and a housing or a backlight, a bonded combination of a board and a housing, a bonded combination of housings in a large electronic device other than a mobile phone, bonded combinations of housings and various devices or boards, and the like.

(2) Adhesion Layer 203

Figure 11:
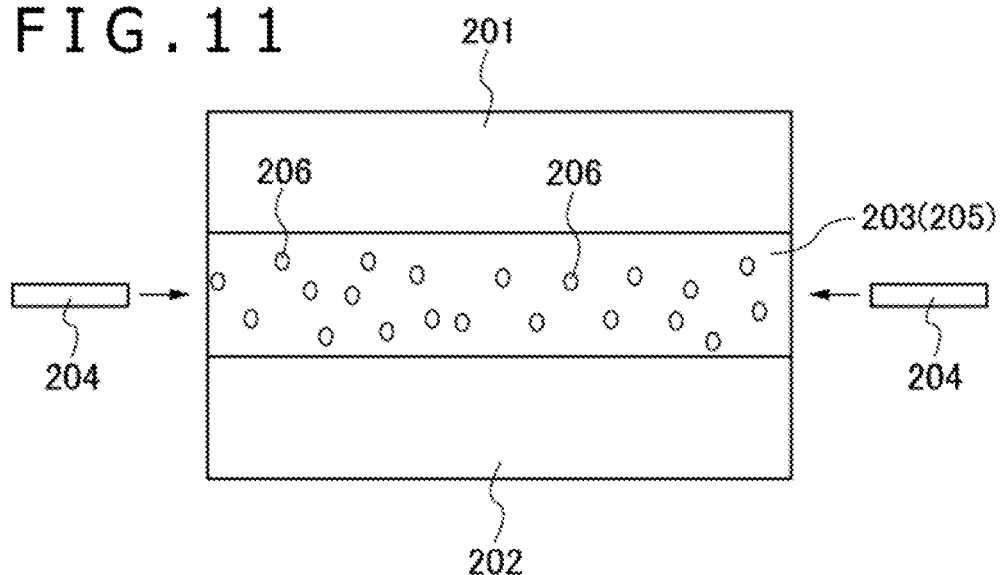
FIG. 11 is a simplified conceptual diagram schematically illustrating the concept of a first embodiment of the adhesion structure according to the present technology.

The adhesion structure according to the present technology includes the adhesion layer 203 bonding the first adherend 201 and the second adherend 202 with each other. As an adhesive for forming this adhesion layer 203, no particular limitation is imposed, and a known adhesive can be used. This adhesion layer 203 is wholly or partly formed as a self-dismantlable adhesion layer 205, which is in contact with at least one of the first adherend 201 and the second adherend 202. The form illustrated in FIG. 11 represents an example that the adhesion layer 203 is wholly formed as the self-dismantlable adhesion layer 205 and is disposed between the first adherend 201 and the second adherend 202.

Here, the term "self-dismantlable adhesion layer 205" means an adhesion layer, which separates itself from the first adherend 201 and/or the second adherend 202 and can be, for example, an adhesion layer or the like with the heat-foaming agent 206 contained therein. As the heat-foaming agent 206, no particular limitation is imposed, and, for example, a known heat-foaming agent can be chosen and used as desired. Examples may include microencapsulated foaming agents, and various inorganic foaming agents and organic foaming agents. Examples of microencapsulated foaming agents may include those which contain liquefied hydrocarbon or the like filled in microcapsules made of polyvinyl chloride, polyvinylidene or the like and allow the liquefied hydrocarbon to readily gasify and expand when heated. On the other hand, representative examples of the inorganic foaming agents include ammonium carbonate, ammonium hydrogen carbonate, sodium hydrogen carbonate, and the like, and representative examples of the organic foaming agents include chlorofluorinated alkanes such as dichloromonofluoromethane, azo compounds such as azobisisobutyronitrile, and the like.

The heat-foaming agent 206 may preferably have a foaming starting temperature set higher than the temperatures under the product reliability guarantee conditions (hereinafter called "guarantee temperatures") for the first adherend 201 and/or the second adherend 202.

In addition, the foaming starting temperature of the heat-foaming agent 206 may preferably be set at as low a temperature as possible while ensuring a tolerance with the guarantee temperatures of the adherends because the heat-foaming agent 206 is required to function as a heat insulator while ensuring to meet the product reliability guarantee conditions for the first adherend 201 and/or the second adherend 202.

More specifically, the foaming starting temperature of the heat-foaming agent 206 may preferably be set higher in the range of 10° C. to 50° C., may more preferably be set higher in the range of 10° C. to 30° C. than the guarantee temperatures of the first adherend 201 and/or the second adherend 202.

(3) Heating Tool(s) 204

In the adhesion structure according to the present technology, heating of the self-dismantlable adhesion layer 205 induces foaming of the heat-foaming agent 206 contained in the self-dismantlable adhesion layer 205, whereby the adhesion layer 203 separates itself from the first adherend 201 and/or the second adherend 202.

As a method for heating the self-dismantlable adhesion layer 205, no particular limitation is imposed, and illustrative are a method that electric energy is directly supplied with a heating tool to generate heat, a method that uses electromagnetic induction by radio-frequency waves, and the like.

The adhesion structure according to the present technology may include one or more heating tools 204 for heating the self-dismantlable adhesion layer 205. As the heating tool or tools 204, no particular limitation is imposed insofar as the heating tool or tools can heat the object, and known heating tool or tools can be used. As each heating tool 204 in the present technology, illustrative is one including at least a heating part to be inserted into the self-dismantlable adhesion layer 205 and an internal power supply for supplying electric energy to the heating part.

The heating part is formed, for example, of a thin-rod-shaped or needle-shaped metal material, and is configured to supply electric energy from the internal power supply. The heating part generates heat with the electric energy supplied from the internal power supply. As a metal material that forms such a heating part, the use of a material of high thermal conductivity is preferred. Examples include copper, brass, aluminum, and the like. Further, as a structure for heating the heating part, illustrative are a structure that an electrical heating element such as a Nichrome wire is wound on the heating part, a structure that burns gas, and the like.

A tip portion of the heating part, the tip portion being formed in a thin rod shape or needle shape, is required to have a configuration that enables to heat the self-dismantlable adhesion layer 205. When heating only the surface of the self-dismantlable adhesion layer 205, for example, the tip portion may be configured to have a planer shape. When heating by inserting the tip portion into the self-dismantlable adhesion layer 205, on the other hand, the tip portion may preferably be formed in a pointed shape.

Here, to ensure the foaming of the heat-foaming agent 206 contained in the self-dismantlable adhesion layer 205, it is preferred to form the tip portion in a pointed shape and to insert the heating part into the self-dismantlable adhesion layer 205.

According to the adhesion structure of the present technology configured as described above, the heating of the self-dismantlable adhesion layer 205 induces the heat-foaming agent 206, which is contained in the self-dismantlable adhesion layer 205, to foam, so that the adhesion layer 203 separates itself from the first adherend 201 and/or the second adherend 202. Without needing to heat the whole adhesion structure as in the past, the first adherend 201 and/or the second adherend 202 can, therefore, be separated without damaging the first adherend 201 and/or the second adherend 202. As a result, the first adherend 201 and/or the second adherend 202 can be recycled.

In the adhesion structure of the form illustrated in FIG. 11, the whole adhesion layer 203 is formed as the self-dismantlable adhesion layer 205. However, the configuration of the adhesion layer 203 shall not be limited to this form.

It is sufficient insofar as the adhesion layer 203 is provided with a chance to separate itself from the first adherend 201 and/or the second adherend 202. As mentioned above, a part of the adhesion layer 203 can be formed as the self-dismantlable adhesion layer 205.

In such a form, the overall strength of the adhesion layer 203 can be improved by using, as an adhesive for the adhesion layer other than the self-dismantlable adhesion layer 205, one capable of providing high hardness. Further, the use of a known adhesive as the adhesive for the adhesion layer other than the self-dismantlable adhesion layer 205 can produce the whole adhesion layer 203 at low cost.

Next, about a second embodiment of the adhesion structure according to the present technology, a description will be made using FIG. 12. The adhesion structure of this second embodiment is different, in the structure of a first adherend 201, from the first adherent according to the first embodiment. On the other hand, they are common in the remaining configurations, so that the description of the remaining configurations is omitted herein.

Described specifically, in the adhesion structure according to the second embodiment, a heating tool insertion hole 207 into which the heating tool 204 is inserted is formed in the first adherend 201. The heating tool insertion hole 207 is open toward the adhesion layer 203 the entirety of which is the self-dismantlable adhesion layer 205.

According to the adhesion structure of this second embodiment, the adhesion layer 203 (the self-dismantlable adhesion layer 205) can be heated using the heating tool 204 inserted in the heating tool insertion hole 207. As a result, the heat-foaming agent 206 contained in the self-dismantlable adhesion layer 205 is induced to foam, so that the adhesion layer 203 separates itself from the first adherend 201 and/or the second adherend 202. Different from the past, the adhesion layer 203 can, therefore, be separated without needing to heat the whole adhesion structure and without damaging the first adherend 201 and/or the second adherend 202. As a consequence, the first adherend 201 and/or the second adherend 202 can be recycled. If the present technology is applied as an adhesion structure in an electronic device such as a mobile phone, it may be difficult to heat the self-dismantlable adhesion layer 205 from the left and right sides of the adhesion structure as illustrated in FIG. 11. In such a case, the self-dismantlable adhesion layer 205 can be heated by providing the heating tool insertion hole 207.

Figure 12:
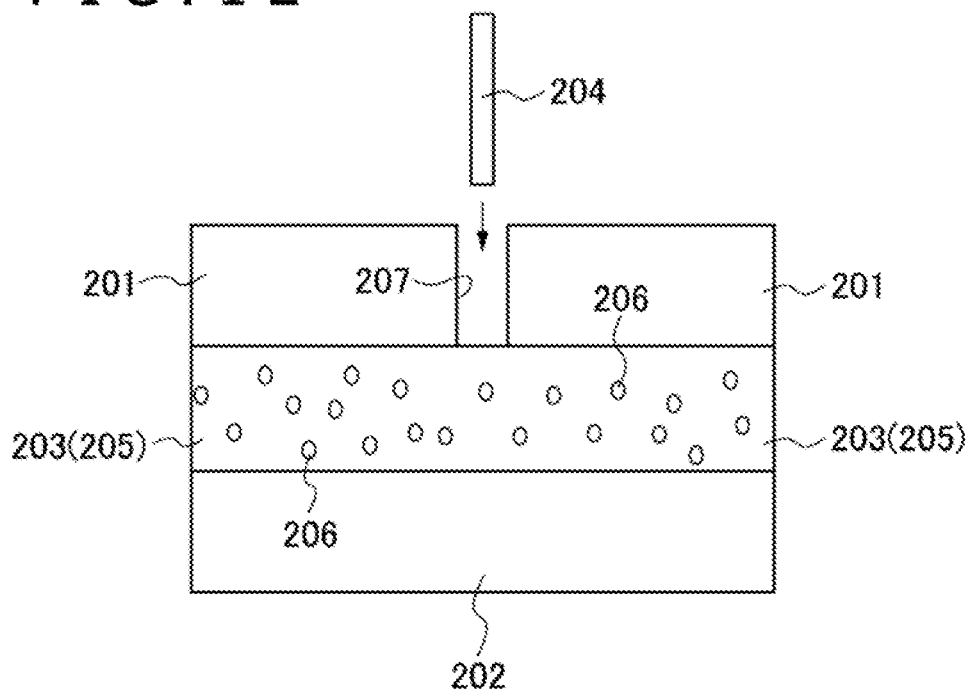
FIG. 12 is a simplified conceptual diagram schematically illustrating the concept of a second embodiment of the adhesion structure according to the present technology.
Figure 13:
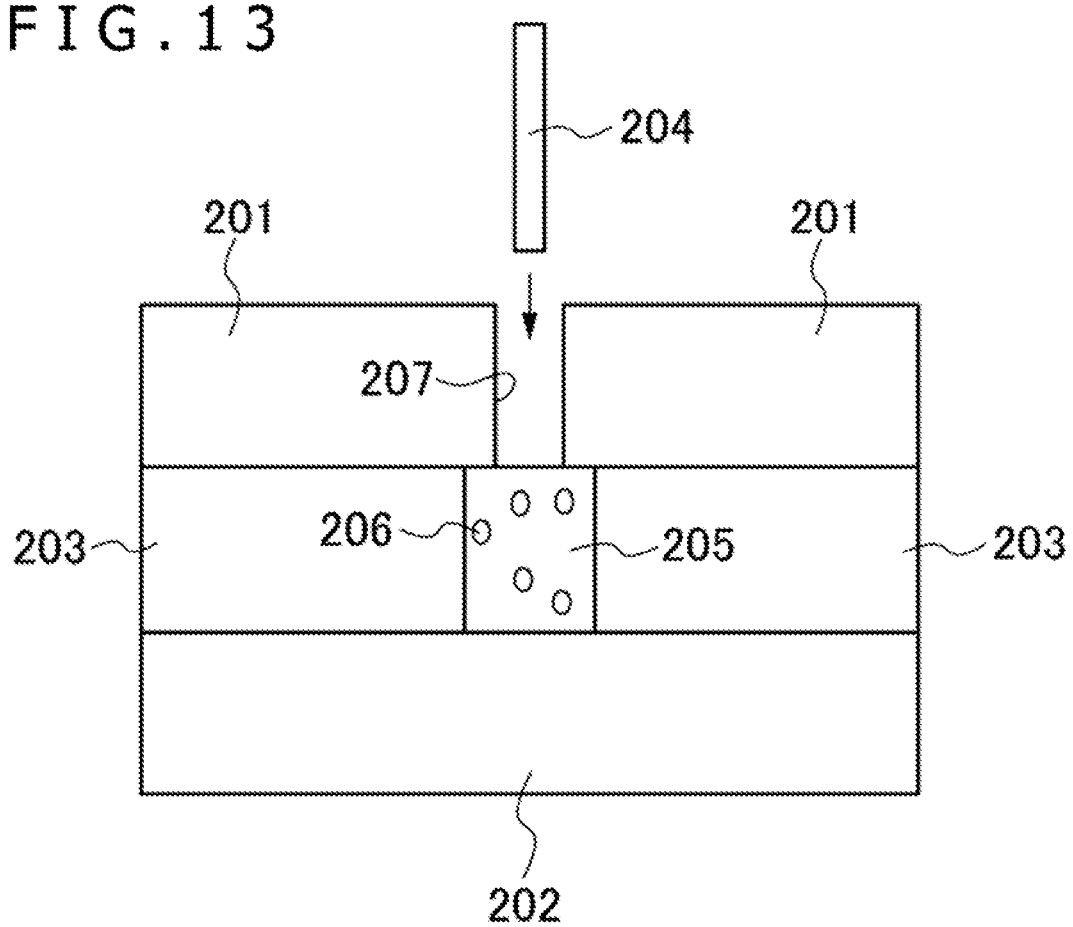
FIG. 13 is a simplified conceptual diagram illustrating a modification of the adhesion structure of FIG. 12.

In the adhesion structure illustrated in FIG. 12, the heating tool insertion hole 207 is formed through the first adherend 201. No problem, however, arises if the heating tool insertion hole 207 is formed through at least one of the first adherend 201 and the second adherend 202. In the adhesion structure illustrated in FIG. 12, one heating tool insertion hole 207 is formed through the first adherend 201. However, no limitation is imposed on the number of heating tool insertion hole(s) 207, and plural heating tool insertion holes 207 may be formed through each of the first adherend 201 and the second adherend 202. In the adhesion structure illustrated in FIG. 12, the whole adhesion layer 203 is formed as the self-dismantlable adhesion layer 205. It is sufficient insofar as the adhesion layer 203 can be provided with a chance to separate itself from the first adherend 201 and/or the second adherend 202. As illustrated in FIG. 13, a part of an adhesion layer 203, the part being in continuation with the heating tool insertion hole 207, can be formed as a self-dismantlable adhesion layer 205 without problem.

Using FIG. 14, a description will next be made about a third embodiment of the adhesion structure according to the present technology. The adhesion structure of this third embodiment is different, in the layout of adhesion layers 203, from the layout of the adhesion layer in the first embodiment illustrated in FIG. 11. On the other hand, they are common in the remaining configurations, so that the description of the remaining configurations is omitted herein.

Described specifically, in the adhesion structure according to the third embodiment, the adhesion layers 203 are disposed on opposite end faces of the first adherend 201 and opposite end faces of the second adherend 202, and therefore the first adherend 201 and the second adherend 202 have been subjected to so-called potting adhesion.

Each adhesion layer 203 is wholly formed as a self-dismantlable adhesion layer 205.

According to the adhesion structure of the third embodiment as described above, heating of the self-dismantlable adhesion layers 205 induces the heat-foaming agent 206, which is contained in the self-dismantlable adhesion layers 205, to foam, and separate themselves from the first adherend 201 and/or the second adherend 202. Different from the past, the adhesion layers 203 can, therefore, separate without needing to heat the whole adhesion structure and without damaging the first adherend 201 and/or the second adherend 202. As a consequence, the first adherend 201 and/or the second adherend 202 can be recycled.

Figure 14:
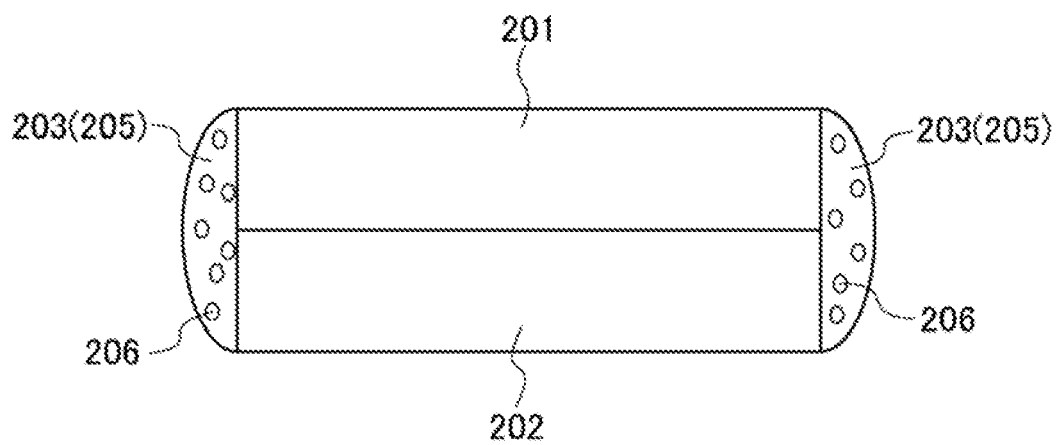
FIG. 14 is a simplified conceptual diagram schematically illustrating the concept of a third embodiment of the adhesion structure according to the present technology.

In the adhesion structure illustrated in FIG. 14, the whole adhesion layers 203 are formed as the self-dismantlable adhesion layers 205. However, the configuration of the adhesion layers 203 shall not be limited to this form. It is sufficient insofar as the adhesion layers 203 can be provided with a chance to separate themselves from the first adherend 201 and/or the second adherend 202. Parts of the adhesion layers 203 may be formed as the self-dismantlable adhesion layers 205 without problem.

Figure 15:
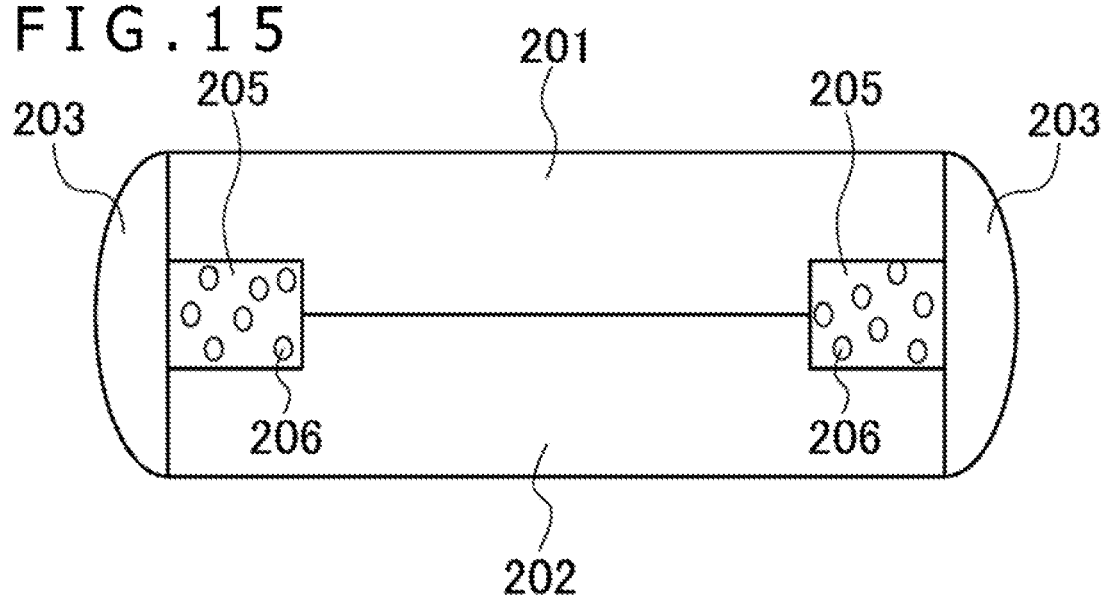
FIG. 15 is a simplified conceptual diagram illustrating a modification of the adhesion structure of FIG. 14.

In the adhesion structure illustrated in FIG. 14, the first adherend 201 and the second adherend 202 have been subjected to so-called potting adhesion. If parts of the adhesion layers 203 are formed as the self-dismantlable adhesion layers 205 in this configuration, the self-dismantlable adhesion layers 205 may preferably be disposed at interfaces between the first adherend 201 and the second adherend 202 as illustrated in FIG. 15 to ensure the separation of the first adherend 201 and the second adherend 202 from each other.

When formed in such a configuration, the first adherend 201 and the second adherend 202 can be surely separated from each other. Further, the overall strength of the adhesion layers 203 can be improved by using, as an adhesive for the adhesion layers other than the self-dismantlable adhesion layers 205, one capable of providing high hardness. Further, the use of a known adhesive as the adhesive for the adhesion layers other than the self-dismantlable adhesion layers 205 can produce the whole adhesion layers 203 at low cost.

Figure 16:
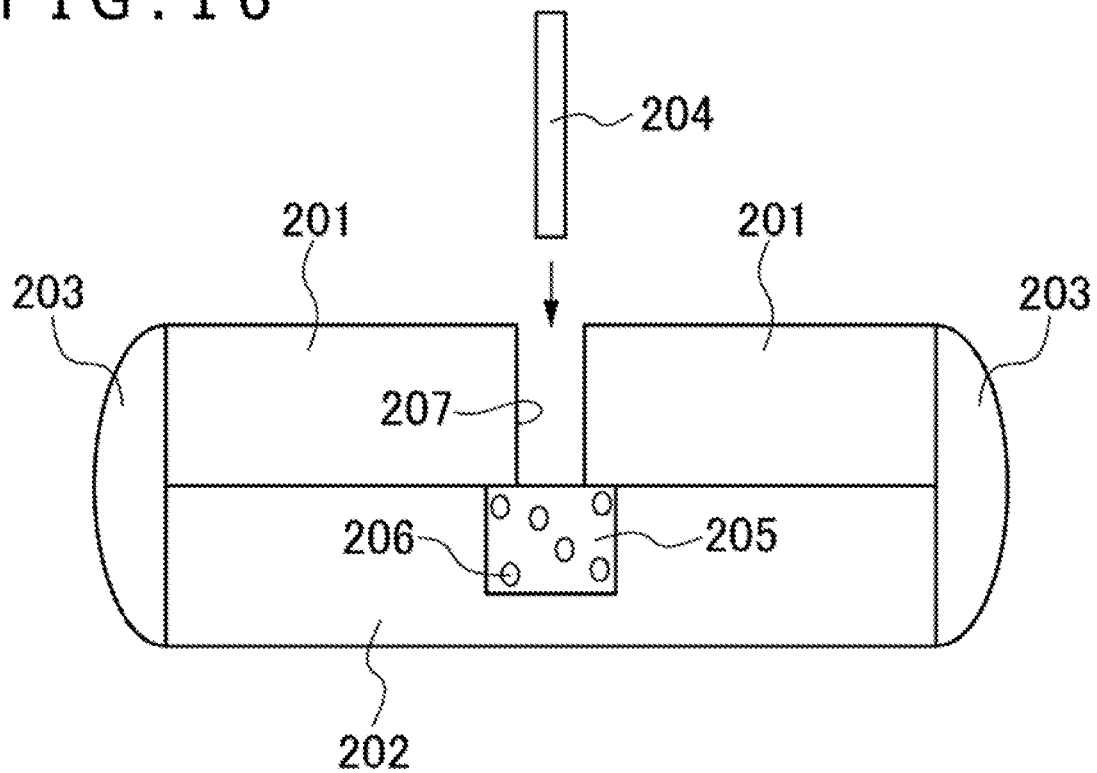
FIG. 16 is a simplified conceptual diagram schematically illustrating the concept of a fourth embodiment of the adhesion structure according to the present technology.

Using FIG. 16, a description will next be made about a fourth embodiment of the adhesion structure according to the present technology. The adhesion structure of this fourth embodiment is different, in the adhesion method between the first adherend 201 and the second adherend 202 and in the structure of the first adherend 201, from the adhesion structure illustrated in FIG. 13. On the other hand, they are common in the remaining configurations, so that the remaining configurations are designated by the same reference numerals herein, and their description is omitted herein.

In the adhesion structure according to the fourth embodiment, the first adherend 201 and the second adherend 202 are bonded with each other via the adhesion layers 203 and a self-dismantlable adhesion layer 205. The adhesion layers 203 are disposed on opposite end faces of the first adherend 201 and opposite end faces of the second adherend 202, and the first adherend 201 and the second adherend 202 have been subjected to so-called potting adhesion.

Further, the further adhesion layer 203 is disposed at the interface between the first adherend 201 and the second adherend 202, and the further adhesion layer 203 is formed as the self-dismantlable adhesion layer 205.

Furthermore, through the first adherend 201, a heating tool insertion hole 207 is formed extending to the self-dismantlable adhesion layer 205. The heating tool insertion hole 207 is configured to permit insertion of the heating tool 204.

According to the adhesion structure of the fourth embodiment as described above, heating of the self-dismantlable adhesion layer 205 induces a heat-foaming agent 206, which is contained in the self-dismantlable adhesion layer 205, to foam, and the first adherend 201 and the second adherend 202 can be separated from each other. Different from the past, the first adherend 201 and the second adherend 202 can, therefore, be separated from each other without needing to heat the whole adhesion structure and without damaging the first adherend 201 and/or the second adherend 202. As a consequence, the first adherend 201 and/or the second adherend 202 can be recycled.

The present technology can also take the following configurations.

(1)

A double-sided, pressure-sensitive adhesive tape including:

a pair of pressure-sensitive adhesive layers; and an electrically-conductive heat generating layer disposed between the paired pressure-sensitive adhesive layers;

at least one of the paired pressure-sensitive adhesive layers containing a heat-foaming agent;

at least one of opposite end faces of the electrically-conductive heat generating layer extending out beyond a corresponding end face of the at least one pressure-sensitive adhesive layer.

(2)

The double-sided, pressure-sensitive adhesive tape as described in (1), wherein the heat-foaming agent has a foaming starting temperature set higher than a guarantee temperature of an adherend to be bonded to the at least one pressure-sensitive adhesive layer, and the electrically-conductive heat generating layer has a heat generating temperature set equal to or higher than the foaming starting temperature.

(3)

The double-sided, pressure-sensitive adhesive tape as described in (1) or (2), wherein the opposite end faces of the electrically-conductive heat generating layer extend out beyond corresponding end faces of the at least one pressure-sensitive adhesive layer, and are disposed in the same planes as corresponding end faces of the other pressure-sensitive adhesive layer.

(4)

The double-sided, pressure-sensitive adhesive tape as described in any one of (1) to (3), wherein each pressure-sensitive adhesive layer contains the heat-foaming agent.

(5)

An electronic device at least including:

an internal power supply that drives the electronic device;

an adherend bonded with the internal power supply; and a double-sided, pressure-sensitive adhesive tape bonding the internal power supply and the adherend with each other;

the double-sided, pressure-sensitive adhesive tape including a first pressure-sensitive adhesive layer bonded with the internal power supply, a second pressure-sensitive adhesive layer bonded with the adherend, and an electrically-conductive heat generating layer disposed between the first pressure-sensitive adhesive layer and the second pressure-sensitive adhesive layer;

at least one of the first pressure-sensitive adhesive layer and the second pressure-sensitive adhesive layer containing a heat-foaming agent;

at least one of opposite end faces of the electrically-conductive heat generating layer extending out beyond a corresponding end face of one of the first pressure-sensitive adhesive layer and the second pressure-sensitive adhesive layer.

(6)

The electronic device as described in (5), wherein the heat-foaming agent contained in the double-sided, pressure-sensitive adhesive tape has a foaming starting temperature set higher than a guarantee temperature of the internal power supply, and the electrically-conductive heat generating layer has a heat generating temperature set equal to or higher than the foaming starting temperature.

(7)

The electronic device as described in (5) or (6), wherein the opposite end faces of the electrically-conductive heat generating layer extend out beyond corresponding end faces of the second pressure-sensitive adhesive layer, and are disposed in the same planes as corresponding end faces of the first pressure-sensitive adhesive layer.

(8)

The electronic device as described in any one of (5) to (7), wherein the first pressure-sensitive adhesive layer contains the heat foaming agent.

(9)

The electronic device as described in any one of (5) to (8), wherein the first pressure-sensitive adhesive layer is bonded with an inner wall of the internal power supply, the inner wall facing the adherend, and also with an outer wall of the internal power supply, the outer wall facing a cover that lies over the internal power supply.

(10)

The electronic device as described in any one of (5) to (9), further including:

a switching element that supplies, to the electrically-conductive heat generating layer, electric energy which would otherwise be supplied from the internal power supply to the electronic device.

(11)

A dismantlable structure including:

a double-sided, pressure-sensitive adhesive tape; and a combination of adherends bonded with each other via the double-sided, pressure-sensitive adhesive tape;

the double-sided, pressure-sensitive adhesive tape including a pair of pressure-sensitive adhesive layers and an electrically-conductive heat generating layer disposed between the paired pressure-sensitive adhesive layers;

at least one of the paired pressure-sensitive adhesive layers containing a heat-foaming agent;
at least one of opposite end faces of the electrically-conductive heat generating layer extending out beyond a corresponding end face of the at least one pressure-sensitive adhesive layer;
the combination of the adherends is dismantled by heating the at least one end face of the electrically-conductive heat generating layer and allowing the at least one pressure-sensitive adhesive layer, which contains the heat-foaming agent, to foam and expand.

(12)
An adhesion structure including:
first adherend;
a second adherend; and
an adhesion layer bonding the first adherend and the second adherend with each other;
the adhesion layer having a self-dismantlable adhesion layer that is in contact with at least one of the first adherend and the second adherend.

(13)
The adhesion structure as described in (12), wherein
at least one of the first adherend and the second adherend is provided with a heating tool insertion hole that extends to the self-dismantlable adhesion layer.

REFERENCE SIGNS LIST 1,104 Double-sided, pressure-sensitive adhesive tape
11,111,111a,111b Pressure-sensitive adhesive layer
12,112 Electrically-conductive heat generating layer
13,113 Heat-foaming agent
101 Electronic device
102 Internal power supply
103 Adherend

The invention claimed is:
1. A double-sided pressure-sensitive adhesive tape, comprising:
a pair of pressure-sensitive adhesive layers, wherein the pair of the pressure-sensitive adhesive layers includes a first pressure-sensitive adhesive layer and a second pressure-sensitive adhesive layer; and
an electrically-conductive heat generating layer between the first pressure-sensitive adhesive layer and the second pressure-sensitive adhesive layer, wherein
the electrically-conductive heat generating layer is in contact with each of the first pressure-sensitive adhesive layer and the second pressure-sensitive adhesive layer,
the electrically-conductive heat generating layer includes a first end face and a second end face that is opposite to the first end face in a longitudinal direction of the double-sided pressure-sensitive adhesive tape,
at least one of the first pressure-sensitive adhesive layer or the second pressure-sensitive adhesive layer includes a heat-foaming agent,
a heat generating temperature of the electrically-conductive heat generating layer is higher than a foaming starting temperature of the heat-foaming agent,
a temperature difference between the heat generating temperature and the foaming starting temperature is in a range of 10° C. to 50° C.,
the heat-foaming agent includes liquefied hydrocarbon in microcapsules of at least one of polyvinyl chloride or polyvinylidene,
each of the first end face and the second end face of the electrically-conductive heat generating layer extends beyond a corresponding end face of the first pressure-sensitive adhesive layer in the longitudinal direction,
the second pressure-sensitive adhesive layer includes a third end face and a fourth end face opposite to the third end face in the longitudinal direction, and
each of the third end face and the fourth end face of the second pressure-sensitive adhesive layer extends beyond a corresponding end face of the first pressure-sensitive adhesive layer in the longitudinal direction.

2. The double-sided pressure-sensitive adhesive tape according to claim 1, wherein
the foaming starting temperature is higher than a guarantee temperature of an adherend, and
the adherend is bonded to the at least one of the first pressure-sensitive adhesive layer or the second pressure-sensitive adhesive layer.

3. The double-sided pressure-sensitive adhesive tape according to claim 1, wherein each of the first pressure-sensitive adhesive layer and the second pressure-sensitive adhesive layer contains the heat-foaming agent.

4. An electronic device, comprising:
an internal power supply configured to drive the electronic device;
an adherend; and
a double-sided pressure-sensitive adhesive tape configured to bond the internal power supply with the adherend,
wherein the double-sided pressure-sensitive adhesive tape includes:
a first pressure-sensitive adhesive layer bonded with the internal power supply;
a second pressure-sensitive adhesive layer bonded with the adherend; and
an electrically-conductive heat generating layer between the first pressure-sensitive adhesive layer and the second pressure-sensitive adhesive layer, wherein
the electrically-conductive heat generating layer is in contact with the first pressure-sensitive adhesive layer and the second pressure-sensitive adhesive layer,
the electrically-conductive heat generating layer includes a first end face and a second end face that is opposite to the first end face in a longitudinal direction of the double-sided pressure-sensitive adhesive tape,
at least one of the first pressure-sensitive adhesive layer or the second pressure-sensitive adhesive layer includes a heat-foaming agent,
a heat generating temperature of the electrically-conductive heat generating layer is higher than a foaming starting temperature of the heat-foaming agent,
a temperature difference between the heat generating temperature and the foaming starting temperature is in a range of 10° C. to 50° C.,
the heat-foaming agent includes liquefied hydrocarbon in microcapsules of at least one of polyvinyl chloride or polyvinylidene,
each of the first end face and the second end face of the electrically-conductive heat generating layer extends beyond a corresponding end face of the first pressure-sensitive adhesive layer in the longitudinal direction, the second pressure-sensitive adhesive layer includes a third end face and a fourth end face opposite to the third end face in the longitudinal direction, and each of the third end face and the fourth end face of the second pressure-sensitive adhesive layer extends beyond a corresponding end face of the first pressure-sensitive adhesive layer in the longitudinal direction.

5. The electronic device according to claim 4, wherein the foaming starting temperature is higher than a guarantee temperature of the internal power supply.

6. The electronic device according to claim 4, wherein the first pressure-sensitive adhesive layer contains the heat foaming agent.

7. A dismantlable structure, comprising:
a double-sided pressure-sensitive adhesive tape; and
a combination of adherends bonded with each other via the double-sided pressure-sensitive adhesive tape, wherein
the double-sided pressure-sensitive adhesive tape includes:
a pair of pressure-sensitive adhesive layers, wherein the pair of the pressure-sensitive adhesive layers includes a first pressure-sensitive adhesive layer and a second pressure-sensitive adhesive layer; and
an electrically-conductive heat generating layer between the first pressure-sensitive adhesive layer and the second pressure-sensitive adhesive layer, wherein
the electrically-conductive heat generating layer is in contact with each of the first pressure-sensitive adhesive layer and the second pressure-sensitive adhesive layer,
the electrically-conductive heat generating layer includes a first end face and a second end face that is opposite to the first end face in a longitudinal direction of the double-sided pressure-sensitive adhesive tape,
at least one of the first pressure-sensitive adhesive layer or the second pressure-sensitive adhesive layer includes a heat-foaming agent,
a heat generating temperature of the electrically-conductive heat generating layer is higher than a foaming starting temperature of the heat-foaming agent,
a temperature difference between the heat generating temperature and the foaming starting temperature is in a range of 10° C. to 50° C.,
the heat-foaming agent includes liquefied hydrocarbon in microcapsules of at least one of polyvinyl chloride or polyvinylidene,
each of the first end face and the second end face of the electrically-conductive heat generating layer extends beyond a corresponding end face of the first pressure-sensitive adhesive layer in the longitudinal direction,
the second pressure-sensitive adhesive layer includes a third end face and a fourth end face opposite to the third end face in the longitudinal direction, and
each of the third end face and the fourth end face of the second pressure-sensitive adhesive layer extends beyond a corresponding end face of the first pressure-sensitive adhesive layer in the longitudinal direction, and
the combination of the adherends is dismantled by
a heating operation of at least one of the first end face or the second end face of the electrically-conductive heat generating layer, and
expansion by a foaming operation of the at least one of the first pressure-sensitive adhesive layer or the second pressure-sensitive adhesive layer includes the heat-foaming agent.

* * * * *